(12) United States Patent
Genetti et al.

(10) Patent No.: US 6,530,074 B1
(45) Date of Patent: Mar. 4, 2003

(54) APPARATUS FOR VERIFICATION OF IC MASK SETS

(75) Inventors: Wayne Andrew Genetti, Sanatoga, PA (US); David George Sotak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/528,071

(22) Filed: Mar. 17, 2000

Related U.S. Application Data
(60) Provisional application No. 60/167,132, filed on Nov. 23, 1999.

(51) Int. Cl.$^7$ .................................................. G06F 11/50
(52) U.S. Cl. .............................. 716/19; 716/20; 716/21
(58) Field of Search ........................... 438/7–10; 257/2, 257/8, 9; 716/18–21, 2

(56) References Cited

U.S. PATENT DOCUMENTS

| | | | |
|---|---|---|---|
| 5,459,355 A | 10/1995 | Kreifels ..................... | 257/758 |
| 5,550,839 A | * 8/1996 | Buch et al. .................... | 716/16 |
| 6,311,316 B1 | * 10/2001 | Huggins et al. .............. | 716/16 |
| 6,337,479 B1 | * 1/2002 | Kley ........................... | 250/234 |
| 6,346,427 B1 | * 2/2002 | Gardner et al. ............... | 438/10 |

* cited by examiner

Primary Examiner—Matthew Smith
Assistant Examiner—Thuan Do
(74) Attorney, Agent, or Firm—Michael J. Urbano

(57) ABSTRACT

A method of fabricating an IC includes forming a test circuit in/on the wafer to electrically indicate that a correct mask set was used during a revision of the IC design during the manufacturing process. The readout of the circuit enables the manufacturer to immediately identify that an incorrect mask set was used, thereby preventing any improperly fabricated devices from being shipped to the customer. The test circuit may be located either in a primary device area or in the corridors between the devices (ICs). In either case, the test circuit includes a plurality of test devices, each test device corresponding to a version of the mask set in which at least one mast level modification has been made. In one embodiment the test devices are verification arrays, each array including a multiplicity of n electrical paths electrically connected in parallel with one another and extending across n of the N ($n \leq N$) structural levels of the wafer/IC (e.g., the poly, window and metal levels). Each of the paths includes n actuatable, series-connected elements corresponding to the masks used to form the n structural levels. After the modification of any one of the masks in a particular version of a mask set, selected elements are actuated in the array to indicate a correct mask version. If an incorrect mask set has been used, the test circuit provides one output signal, whereas if the correct mask set was used, the test circuit provides a different output signal. Also disclosed is a semiconductor wafer that includes such a test circuit either within a primary IC area or within a corridor between ICs.

14 Claims, 4 Drawing Sheets

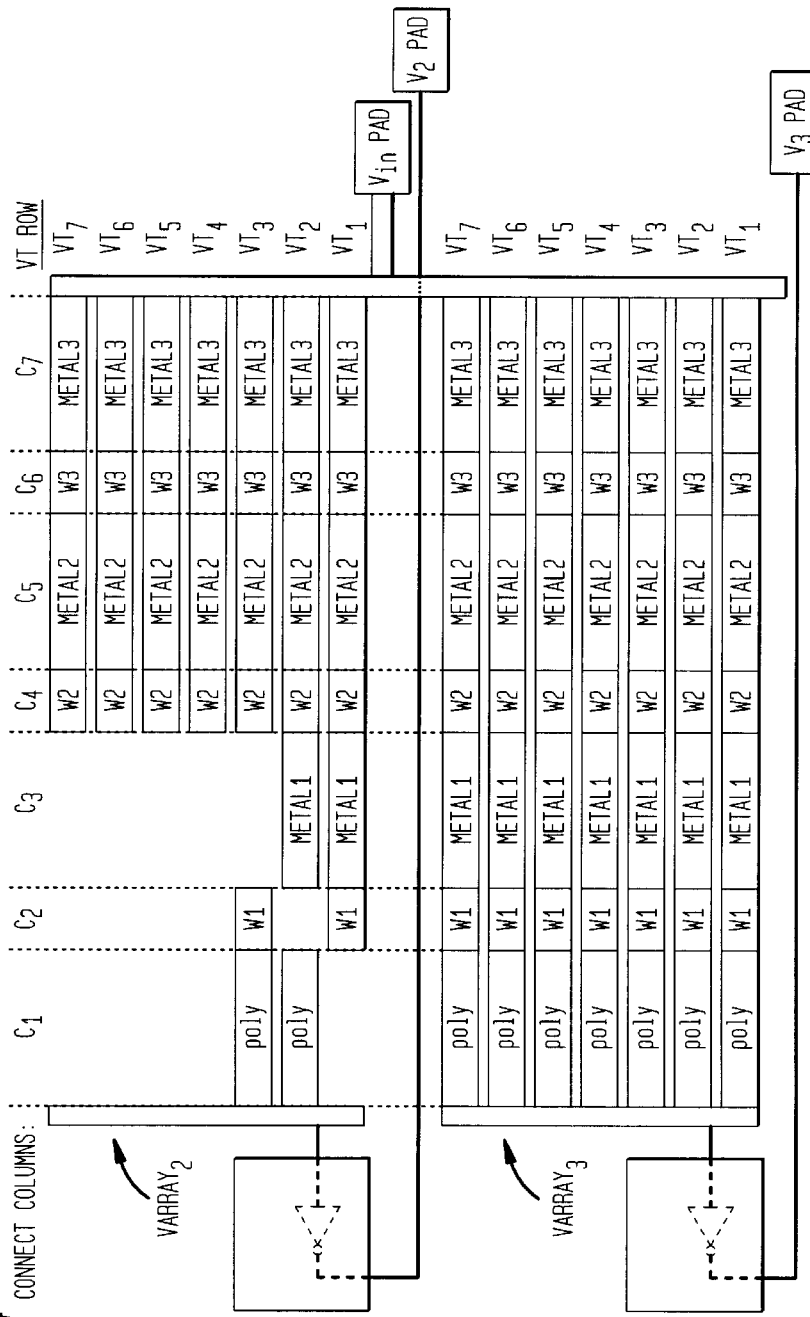

APPARATUS FOR VERIFICATION OF IC MASK SETS

CROSS-REFERENCE TO RELATED APPLICATIONS

This application claims priority from copending, provisional application Serial No. 60/167,132 filed on Nov. 23, 1999.

FIELD OF THE INVENTION

This invention relates generally to integrated circuits (ICs) and, more particularly, to verifying that the correct set of masks have been used in the fabrication of an IC.

BACKGROUND OF THE INVENTION

A typical IC is a multi-layered device that includes, for example, source/drain and tub regions formed in a Si substrate (TRANSISTOR level) and a polysilicon layer used to form part of a gate stack on the substrate (POLY level). A multiplicity of interconnect layers (i.e., metal layers (METAL levels) are separated by insulating layers with windows or vias formed therein (WINDOW levels) to allow metal layers at different levels to be connected to one another. In the fabrication of each of these levels of an IC, one or more patterned quartz masks (referred to as a mask set) are used in conjunction with standard photolithography and etching techniques to transfer the patterns into the various layers of the IC. Each quartz mask has a metalized pattern thereon that defines the structure to be formed in the IC at the corresponding mask level.

Despite careful quality control procedures, from time to time an incorrect mask set is used in the fabrication of an IC. For example, ICs are prone to incorrect mask selection when multiple mask versions are generated from an original IC design, each version involving changes to one or more of the POLY, WINDOW and/or METAL mask levels. Consequently, multiple versions of an approved mask level (or mask set) may be present at the wafer fabrication facility, thus complicating the manufacturing process. In the models phase of fabrication especially, this approach is error prone due to vague/imprecise documentation of the mask changes required with each version change or due to incorrect interpretation/identification by fabrication engineers of the correct set of masks that correspond to each version. In contrast, design revisions requiring changes to mask levels prior to POLY (e.g., at the TRANSISTOR level) usually result in a completely new mask set, thereby eliminating the ambiguity.

Using an incorrect mask in most cases results in a functional change in the IC that in turn produces an extremely low (often zero) yield when the IC is tested while it is still in wafer form (i.e., before the individual ICs are separated from one another). Resolving zero yield at this level of testing involves failure analysis time to first identify the nature of the problem, and when it is mask-related to then provide the fabrication engineers with the correction.

A more insidious problem occurs when the use of an incorrect mask does not significantly impact yield, and the use of that mask goes undetected through the lengthy process from wafer fabrication, wafer and package testing, and device characterization, to customer qualification Ultimately the defective IC is shipped to the customer who receives a device that does not meet the design intent and may fail either during customer testing or end user application. This form of the problem is a major deficiency in the fabrication process, adversely affects device quality and reliability, and is likely to diminish customer confidence in the manufacturer.

In order to address this problem in the prior art, a version marker is added to all POLY and METAL masks that are regenerated for each new mask version. The marker provides a visual indication that a new POLY or METAL mask was used in the fabrication of an IC. However, these version markers are vertically stacked, so that when the wafer is viewed with a microscope, a logical OR function is produced that indicates only that at least one mask was changed. In order to insure that all of the correct version masks were used, a detailed visual check of the completed IC is required, combined with a comparison of the data base containing the correct mask requirements for each version versus the masks printed. The cross-checking process is often time consuming and is still open to interpretation (and hence error) as to which masks are required for each version.

Thus, a need remains in the art for a technique to readily and reliably identify that a correct mask set has been used in the manufacture of an IC.

SUMMARY OF THE INVENTION

In accordance with one aspect of our invention, a method of fabricating an IC includes forming a test circuit in/on the wafer to electrically indicate that a correct mask set was used during a revision of the IC design during the manufacturing process. The readout of the circuit enables the manufacturer to immediately identify that an incorrect mask set was used, thereby preventing any improperly fabricated devices from being shipped to the customer. The test circuit may be located either in a primary device area or in the corridors between the devices (ICs). In either case, the test circuit includes a plurality of test devices, each test device corresponding to a version of the mask set in which at least one mask level modification has been made. In one embodiment the test devices are verification arrays, each array including a multiplicity of n electrical paths electrically connected in parallel with one another and extending across n of the N (n<N) structural levels of the wafer/IC (e.g., the poly, window and metal levels). Each of the paths includes n actuatable, series-connected elements corresponding to the masks used to form the n structural levels. After the modification of any one of the masks in a particular version of a mask set, selected elements are actuated in the array to indicate a correct mask version. If an incorrect mask set has been used, the test circuit provides one output signal, whereas if the correct mask set was used, the test circuit provides a different output signal In accordance with another aspect of our invention, a semiconductor wafer includes such a test circuit either within a primary IC area or within a corridor between ICs, and in accordance with yet another aspect of our invention an individual IC includes both a functional circuit and such a test circuit.

BRIEF DESCRIPTION OF THE DRAWING

Our invention, together with its various features and advantages, can be readily understood from the following more detailed description taken in conjunction with the accompanying drawing, in which:

FIG. 4 is a block diagram of a test circuit in accordance with an illustrative embodiment of our invention showing the VT connectivity of VERSION 2 for VARRAY$_2$ and VARRAY$_3$ following the illustrative VT connections given in FIG. 5. The VTs depict changes in the POLY, W1 and METAL1 masks;

FIG. 5 is a table showing illustrative VT connections for the POLY, WINDOW AND METAL mask changes for the VARRAYs of FIG. 4.

In the interest of clarity and simplicity, the figures have not been drawn to scale.

DETAILED DESCRIPTION OF THE INVENTION

Figure 1:
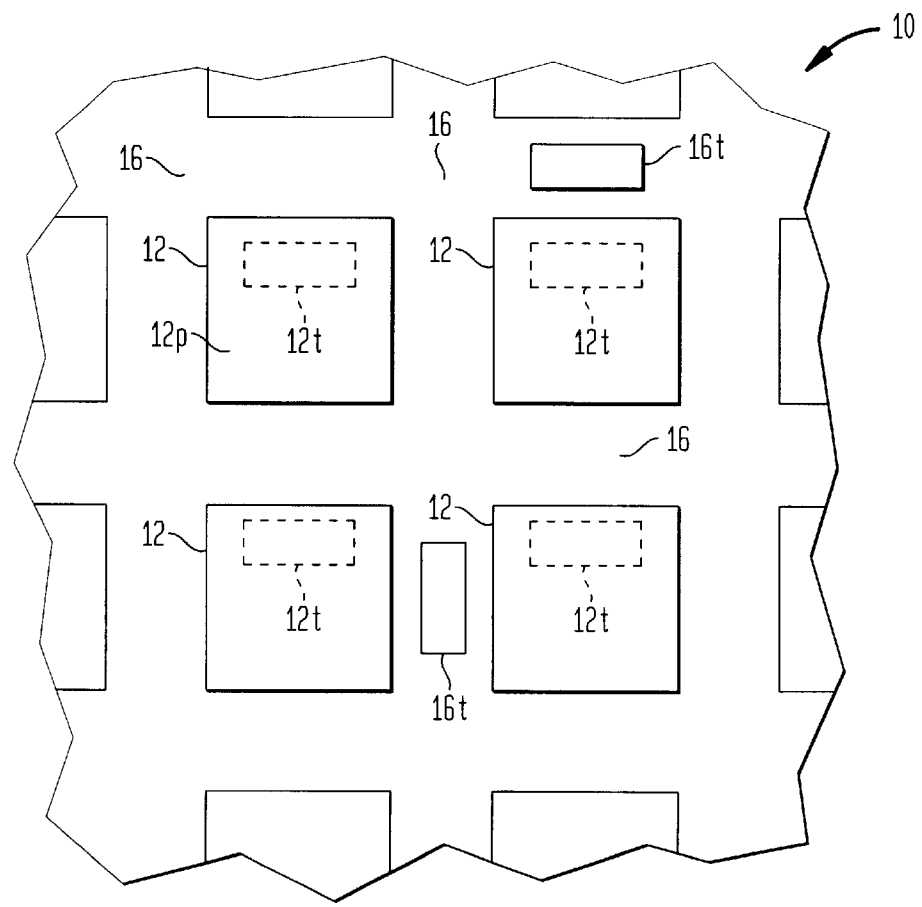
FIG. 1 is a schematic, top view of a wafer showing the alternative location of test circuits in accordance with one embodiment of our invention.

With reference to FIG. 1, a semiconductor wafer 10 comprises a multiplicity of integrated circuits (ICs) 12 separated from one another by corridors 16. Each IC includes a primary device or functional circuit 12$p$ and, in accordance with one embodiment of our invention, a test circuit 12$t$. The latter provides an electrical indication that the correct mask set (or incorrect mask set) was used in the fabrication of the wafer. Alternatively, the test circuit may be located in the corridors 16, as shown by the circuit blocks designated 16$t$, a design that is particularly attractive when area within the primary device is at a premium.

In either case, the functional and test circuits include a multiplicity of N stacked structural levels, as is well known in the IC art; for example, a TRANSISTOR level at which source/drain regions, tub regions, etc. are formed, a POLY level at which a portion of the gate stack is formed, and a multiplicity m<N interconnect levels; i.e., WINDOW and METAL levels at which interconnects are formed between devices on the same level and/or on different levels. These structural levels are formed by using a set of patterned masks (e.g., quartz masks with patterned metal thereon) and standard photolithography and etching techniques to define the TRANSISTOR level in the substrate and to shape deposited polysilicon, insulating and metal layers in the POLY, WINDOW and METAL levels. As described later, our invention may be used to verify the masks for a subset n of the N structural levels, where n<N; e.g., it is not uncommon that the masks used to fabricate the TRANSISTOR level are not tested, and that only the masks of the POLY, WINDOW AND METAL levels are tested. In the latter case n=1+2 m.

From time to time during the design and fabrication processes the mask set may be modified by the circuit designer; that is, one or more masks of VERSION 1 may be altered to form a VERSION 2 mask set. At some later time, one or more masks of VERSION 2 may be changed to yield a VERSION 3 mask set, and so on. In order to ensure that the correct mask set is used in the fabrication of the ICs, the test circuits 12$t$ or 16$t$ are incorporated into the wafer in accordance with our invention. Thus verification may occur at the wafer level using either test circuits 12$t$ or 16$t$, or it may occur at the device level (i.e., after the wafer is diced into separate devices) using test circuits 12$t$.

Figure 2:
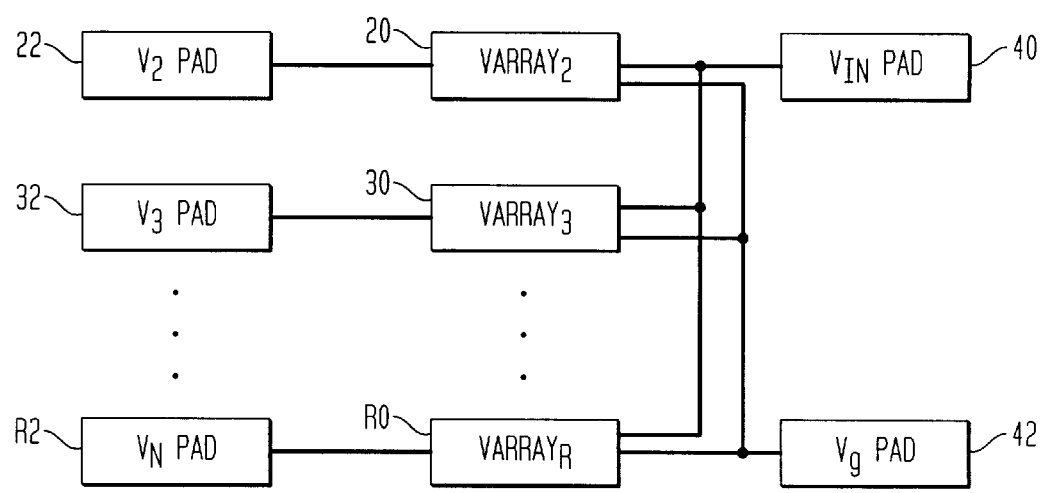
FIG. 2 is a block diagram of a test circuit for use in the arrangement FIG. 1 including a parallel arrangement of Verification Arrays (VARRAYs)

In either case, the test circuit 12t or 16t comprises a plurality of test devices, each test device corresponding to a version of a mask set in which at least one modification of the mask set has been made. In one embodiment of our invention, as shown in FIG. 2, R test devices 20, 30, ... R0 are provided to accommodate a maximum of R revisions or versions of the IC mask set. The inputs to the test devices are coupled to a common input signal ($V_{in}$) pad 40 and to a common reference potential (e.g., $V_g$ or ground) pad 42, whereas the outputs of the test devices are coupled to separate output voltage ($V_2, V_3 \ldots V_R$) pads 22, 32, ... R2. By definition the first version of the IC, VERSION 1, corresponds to the original design of the IC before any subsequent modifications to the mask set have been made. VERSION 2, therefore, corresponds to the VERSION 1 mask set in which at least one mask of VERSION 1 has been replaced by a different mask, and so on. By altering the test device on a mask set, the final product can be tested to determine if the correct mask set for the IC was used during its manufacture. This determination can be made at the wafer level using, for example, test circuits such as 16$t$ (FIG. 1) or at the device level using test circuits such as 12$t$ (FIG. 1).

Figure 3B:
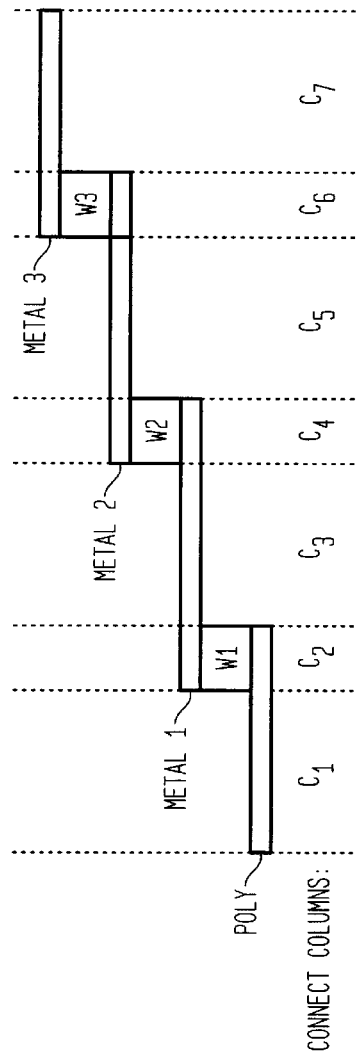
FIG. 3B is a schematic diagram showing how an illustrative VT of FIG. 3A extends across n=7 of the structural levels of the wafer/IC.
Figure 3A:
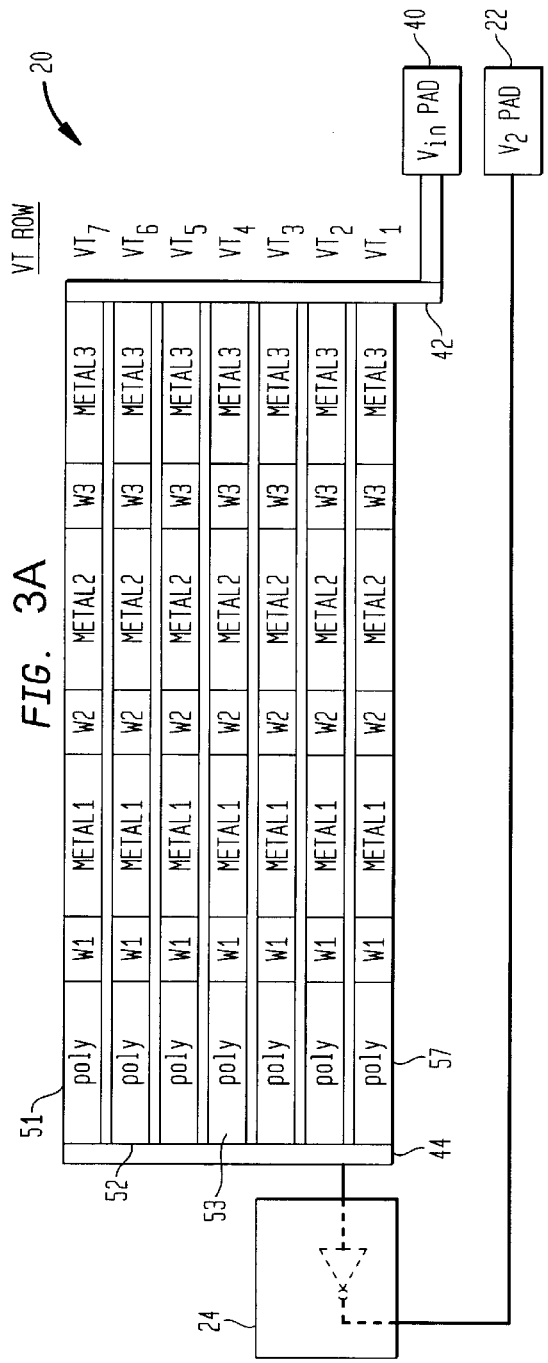
FIG. 3A is a schematic, block diagram of a VARRAY showing the parallel connection of a multiplicity of Verification Traces (VTs) in accordance with one embodiment of our invention.

In an illustrative embodiment of our invention, each test device is a verification array VARRAY$_r$, where 2<r<R. As shown in FIG. 3A, each VARRAY comprises a multiplicity of n electrical paths, referred to as Verification Traces (VT$_i$, i=1, ... n), electrically connected in parallel with one another; i.e., the input ends of the VTs are shorted by conductor 42 and the output ends by conductor 44. As shown in FIG. 3B, each VT extends across n of the N structural levels of the IC/wafer. For purposes of illustration only, FIG. 3A shows the case for n=7 (out of N=8) structural levels corresponding to one POLY level and m=3 interconnect levels each including a WINDOW level (Wk, k=1, ... ,m) and a METALk level (k=1, ... ,m). (In this embodiment, the TRANSISTOR level has not been included in n.) Larger and smaller values of n are within the scope of the invention. In any case, each of the parallel paths 51–57 includes n actuatable, series-connected elements corresponding to the masks used to form the n structural levels. The actuatable elements may be either active or passive devices. In a preferred embodiment the elements are passive links, and within each VT each link is located on a different structural level Here, a link is defined as a physical and electrical connection between two adjacent levels that allows current to flow from one structural level to an adjacent structural level For example, in FIG. 3A each VT comprises a polysilicon runner link (labeled poly in column $C_1$) and one window or via link (also known as a plug and labeled Wk) and one metal runner link (labeled METALk) in columns $C_2$ to $C_7$, where k=1, ... m. The $V_{in}$ pad 40 is connected to all seven of the VTs 51–57 at one end of the paths (i.e., at the highest metal level; METAL3 in this case), and the other ends of the paths (i.e., at the POLY level in this case) are shorted by the conductor 44, as discussed earlier. The POLY level is coupled to pull-down resistor (not shown) at the input of an inverter 24. The output of the inverter 24 is coupled to the $V_2$ pad. The other VARRAYs are configured in a similar fashion.

In this illustration, the state of a particular element (link) is initially a closed circuit and is changed (i.e., actuated) by creating an open circuit at the location of that element in the corresponding VT. For example, in a given VT an open circuit can be formed between the POLY and METAL1 levels by omitting (or removing) any one of the POLY (column $C_1$), W1 (column $C_2$) or METAL1 (column $C_3$) links of that VT.

In operation, a $VARRAY_r$ ($2<r<R$) functions as follows. A test circuit 12$t$ or 16$t$ may be operated, for example, at the time a wafer undergoes other, standard IC tests (e.g., capacitance-voltage and/or current-voltage tests). Under such circumstances a high voltage (determined by the technology of the IC) is applied to the $V_{in}$ pad 40. An indication that a wrong mask set has been used occurs if at least one VT in $VARRAY_r$ has a closed circuit between the input and output shorts (in FIG. 3A, shorts 42 and 44, respectively); that is, in at least one VT all of the elements are closed (e.g., all links are present) and hence capable of carrying current from the input to the output of the array. (In the illustration of FIG. 3A, all of the elements means the POLY, W1, METAL1, W2, METAL2, W3 and METAL3 elements.) When this condition is satisfied, then a low voltage or logic 0 will be observed at the $V_r$ output pad. In contrast, an indication that a correct mask set has been used occurs if none of the VTs in $VARRAY_r$ forms a closed circuit between the input and output of the array; that is, at least one element is an open circuit in each VT (e.g., at least one link is absent in each VT. Then the pull down resistor will cause a low voltage at the input of the inverter 24, thereby causing a high voltage or logic 1 to be observed at the $V_r$ output pad.

This logic can be applied to the various versions of a mask set depending on the particular version in question. At the time that the first masks (VERSION 1) of an IC are made, all of the elements are closed (e.g., all links are present) for every VT in every VARRAY. When a VERSION 1 wafer is tested, all of the output pads will be at a low voltage or logic 0. When the mask set of an IC is modified for the $y^{th}$ time (VERSION$_Y$, where $2<y<R$), the VARRAY logic is as follows: (1) For $VARRAY_q$ (i.e., older versions, q<y), the state of all of the elements is identical to that of the previous version; (2) For $VARRAY_q$ (q>y), the state of selected elements is changed (e.g., selected links are removed to form open circuits in FIG. 3A) to provide the proper mask indication; and (3) For $VARRAY_q$ (i.e., future versions, q>y), the state of all elements remains the same and unchanged (e.g., all links are present and form closed circuits, as in FIG. 3A).

In general, changes in the states of the elements of $VARRAY_y$ can be made only in those mask levels (VTs) that are being changed in the $y^{th}$ version. The changes are made in such a way that when an IC is made using the correct mask set, at least one element of each VT will be an open circuit and a high voltage will appear at the $V_y$ output pad.

The following table shows the expected values of each output pad for a particular mask set version for the illustrative embodiment of FIG. 2, where R=5.

| Mask Set Version # | $V_2$ Pad Logic | $V_3$ Pad Logic | $V_4$ Pad Logic | $V_{5\ Pad}$ Logic |
| --- | --- | --- | --- | --- |
| 1 | 0 | 0 | 0 | 0 |
| 2 | 1 | 0 | 0 | 0 |
| 3 | 1 | 1 | 0 | 0 |
| 4 | 1 | 1 | 1 | 0 |
| 5 | 1 | 1 | 1 | 1 |

The logic algorithm used to determine the state of the elements of each VT (i.e., the VT connectivity of FIG. 3A) is given in standard software program format by:

For n=1 until n=(1+2 m)
  For j=1 until j=(1+2 m)

if $j=n$, then $VT_nC_j$=NOT ($L_j$)     (1)

if $j \neq n$, $VT_nC_j$=NOT [$L_j$ AND NOT($L_n$)]     (2)

where $1<j<(1+2\ m)$ and j refers to the links in the VT rows, and where $1<n<(1+2\ m)$ and n refers to links in the VT columns. Lj=1 designates that a mask is to be changed in the $j^{th}$ structural level, and conversely Lj=0 means that a mask in the $j^{th}$ level is not changed. Thus, j=1, designates the POLY link, j=2 designates the W1 link, j=3 designates the METAL1 link, and so on), and $C_j$ designates the group of links at each structural level (i.e., $C_1$ designates the group of POLY links, $C_2$ designates the group of W1 links, $C_3$ designates the group of METAL1 links, and so on). This algorithm is typically programmed into a computer and used in conjunction with the circuit designers mask revision instructions (e.g., FIG. 5) to determine the VT connectivity.

ILLUSTRATION

Figure 6:
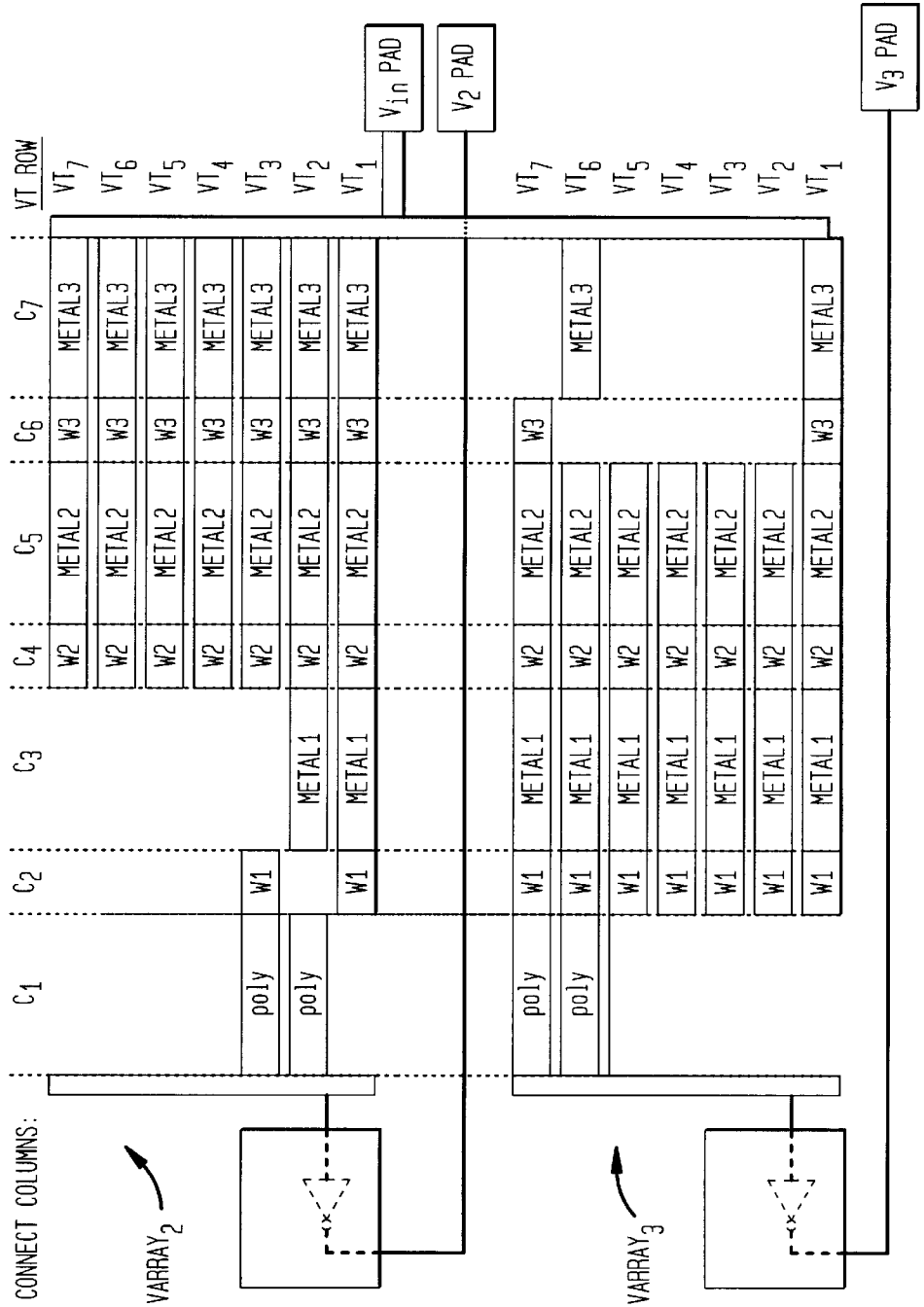
FIG. 6 is a block diagram of a test circuit in accordance with an illustrative embodiment of our invention showing the VT connectivity of VERSION 3 for new POLY, W3 and METAL3 masks. This version is built upon VARRAY$_2$ for which POLY, W1 and METAL1 masks were modified.

An illustration of the application of the algorithm is shown in FIGS. 4–6. This illustration assumes that (1) the IC structural levels include one POLY and six WINDOW-METAL levels, (2) mask changes will be made only in these seven levels (i.e., not in the TRANSISTOR level), and (3) VERSION 2 mask changes involve changes in only the POLY, W1 and METAL1 levels; i.e., in $VARRAY_2$, in POLY column $C_1$, five of the seven POLY links have been opened as shown by the blank spaces in the positions corresponding to $VT_7$ to $VT_4$, and $VT_1$; in $VARRAY_2$, in W1 column $C_2$, open links are shown at $VT_7$ to $VT_4$, and $VT_2$; and in $VARRAY_2$, in METAL1 column $C_3$, open links are shown at $VT_7$ to $VT_3$. FIG. 5 shows these mask changes and the corresponding state of the links of $VARRAY_2$, where logic 1 indicates that a mask is to be changed and that a link is present (capable of conducting current between links adjacent thereto and, ultimately, if all links in the VT are present, capable of conducting current from the $V_{in}$ input pad to the $V_2$ output pad), and logic 0 indicates that a link is absent (incapable of conducting current between links that would have been adjacent thereto, and, if any link is open in the VT, then no current flows in that VT from the $V_{in}$ input pad to the $V_2$ output pad).

The application of logic equation (1) is illustrated by taking the case of n=j=2, which identifies the window level W1 at the intersection of $VT_2$ and $C_2$ in $VARRAY_2$ of FIG. 4. Then FIG. 5 shows that the circuit designer has designated a mask change for this element by setting $L_2$=1. Therefore, equation (1) gives $VT_2C_2$=NOT(L)=0; i.e., the window W1 link at this location should be absent as shown in FIG. 4. On the other hand, the application of logic equation (2) is illustrated by taking the case of n=2, j=3, which identifies the metal level METAL1 at the intersection of $VT_2$ and $C_3$ in $VARRAY_2$ of FIG. 4. As above, FIG. 5 shows that the circuit designer has designated a mask change for this element by setting L2=1 and L3=1. Therefore, equation (2) gives $VT_2C_3$=NOT[1 AND NOT(1)]=1; i.e., METAL1 at this location should be present (a closed circuit) as shown in FIG. 4.

In operation, if an old mask set, which would have all links present, were inadvertently used in the manufacturing process of this IC, a low voltage would appear at the $V_2$ output pad because the old version(s) mask would make an electrical connection between the $V_{in}$ pad and the inverter input through at least one VT of $VARRAY_2$. On the other hand, since $VARRAY_3$ corresponds to a future mask set revision, all links in the VTs of $VARRAY_3$ are closed.

To better understand.this operation, consider $VARRAY_2$ of FIG. 4, which indicates that three masks have been changed: the POLY, W1 and METAL1 masks. More specifically, these changes are indicated by the missing links in $VT_7$ to $VT_4$ and $VT_1$ of column $C_1$, the missing links in $VT_7$ to $VT_4$ and $VT_2$ of column $C_2$, and the missing links in $VT_7$ to $VT_3$ of column $C_3$. If any one of the original version of these three changed masks were inadvertently used in the manufacture of the IC, then a closed electrical connection (e.g., a short circuit) would exist between conductors 42 and 44. For example, if the original METAL1 mask were inadvertently used, then in column $C_3$ all links would be present and a short would exist across $VT_3$, thereby providing an indication at the $V_2$ pad that a wrong mask had been used. However, the indication would not identify the particular wrong mask that had been used. That determination would be made by other, well-known procedures (e.g., by viewing the links under a microscope). In summary, therefore, this embodiment of our invention provides a go/no-go indication for a particular masks set.

From FIGS. 4 & 5 two features are apparent. First, when a VT mask level is to be changed (i.e., as indicated by a logic 1 appearing in FIG. 5 under the heading MASK Change), all links are closed except for the corresponding masks of the VT element; e.g., L2=1 means that W1 is to be changed, so all links are present in $VT_2$ except for the one in column $C_2$. In this embodiment, this feature is the key to determining that a incorrect mask set was used. If at least one old mask had been used, at least one VT in the VARRAY will have all of its links present, thereby providing a high voltage (logic 1) at the input to the inverter. Hence a low voltage (logic 0) would appear on that VT's output pad. Second, when a VT mask level for a particular version is not changed, as indicated by a logic 0 appearing in FIG. 5 under the heading MASK Change, then a new mask is not generated and the corresponding VT links remain present (closed). For example, in FIGS. 4 & 5 L4, L5, L6 and L7 are all equal to logic zero. Therefore, the W2, METAL2, W3 and METAL3 masks do not change, which, in turn, means that in all VTs the links in columns $C_4$ to $C_7$ are present (remain closed). On the other hand, all VT links corresponding to masks that are to be changed, as indicated by logic 1 in FIG. 5, would be absent (open). For example, L1, L2 and L3 are all equal to logic 1. Therefore, in $VT_7$, for example, the links in columns $C_1$, $C_2$ and $C_3$ would be absent (open).

In a similar fashion, FIG. 6 shows the case where VERSION 3 mask set changes are recorded in $VARRAY_3$, although the corresponding instructions (as in FIG. 5) are not shown. FIG. 6 illustrates changes in the POLY, WINDOW3 AND METAL3 masks.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the various structural levels of an IC and test circuit may be formed on an elemental wafer substrate such as Si or on a compound wafer substrate such as GaAs or InP.

What is claimed is:

1. A semiconductor wafer comprising:
   a multiplicity of integrated circuits (ICs) formed in/on said wafer, each of said ICs including a multiplicity of N stacked structural levels that are formed using a set of masks together with photolithographic etching techniques, said ICs being separated from one another and at least one test circuit, characterized in that said at least one test circuit includes a plurality of test devices, each test device corresponding to a version of said mask set in which at least one modification to said mask set may have been made.

2. The invention of claim 1 wherein
   each of said test devices comprises a verification array,
   each of said arrays includes a multiplicity of n≦N electrical paths connected in parallel with one another and extending across n of said structural levels, each of said paths including n actuatable, series-connected elements corresponding to said masks used to form n of said structural levels, and
   selected ones of said elements in the array being actuated, each actuated element corresponding to a mask that was modified in a version of said mask set corresponding to said array.

3. The invention of claim 2 wherein said actuatable elements are formed as a series of connected links that are selectively removed to indicate mask changes at a particular structural level.

4. The invention of claim 3 wherein at least one of said elements is located at each of said n structural levels.

5. The invention of claim 2 further including an input voltage pad and a multiplicity of output signal pads, and wherein within each array one end of each of said paths is coupled to said input voltage pad and the other end of each of said paths is coupled to one of said output signal pads, and wherein each of said arrays has said input signal pad in common and has separate output signal pads.

6. The invention of claim 1 wherein at least one of said test circuits is located within each of said ICs.

7. The invention of claim 1 wherein said at least one test circuit is located within at least one of said corridors.

8. The invention of claim 1 wherein said structural levels include a polysilicon level and a multiplicity m of window levels alternating with a multiplicity m of metal levels, where n=(1+2 m).

9. An integrated circuit (IC) comprising:
   a multiplicity of N stacked structural levels that are formed using a set of masks together with photolithographic etching techniques,
   said structural levels forming within said IC a functional circuit and at least one test circuit, characterized in that
   said at least one test circuit includes a plurality of test devices, each test device corresponding to a version of said mask set in which at least one modification to said mask set may have been made.

10. The invention of claim 9 wherein
    each of said test devices comprises a verification array,
    each of said arrays includes a multiplicity of n≦N electrical paths connected in parallel A with one another and extending across n of said structural levels, each of said paths including n actuatable, series-connected elements corresponding to said masks used to form n of said structural levels, and
    selected ones of said elements in the array being actuated, each actuated element corresponding to a mask that was modified in a version of said mask set corresponding to said array.

11. The invention of claim 10 wherein said actuatable elements are formed as a series of connected links that are selectively removed to indicate mask changes at a particular structural level.

12. The invention of claim 10 wherein at least one of said elements is located at each of said n structural levels.

13. The invention of claim 10 further including an input voltage pad and a multiplicity of output signal pads, and wherein within each array one end of each of said paths is coupled to said input voltage pad and the other end of each of said paths is coupled to one of said output signal pads, and wherein each of said arrays has said input signal pad in common and has separate output signal pads.

14. The invention of claim 9 wherein said structural levels include a polysilicon level and a multiplicity m of window levels alternating with a multiplicity m of metal levels, where $n=(1+2\,m)$.

* * * * *